United States Patent [19]

Kuwano

[11] Patent Number: 4,857,780

[45] Date of Patent: Aug. 15, 1989

[54] HIGH WITHSTAND VOLTAGE OUTPUT

[75] Inventor: Hiromichi Kuwano, Tokyo, Japan

[73] Assignee: Texas Instrument Incorporated, Dallas, Tex.

[21] Appl. No.: 245,999

[22] Filed: Sep. 14, 1988

Related U.S. Application Data

[63] Continuation of Ser. No. 55,492, May 28, 1987, abandoned.

[30] Foreign Application Priority Data

Jun. 9, 1986 [JP] Japan .................. 61-134503

[51] Int. Cl.$^4$ ........................................... H03K 17/10
[52] U.S. Cl. ..................................... 307/574; 307/570; 307/581; 307/270; 307/200
[58] Field of Search .............. 307/200 A, 200 B, 446, 307/448, 450, 451, 454, 475, 570, 574, 581, 264, 270

[56] References Cited

U.S. PATENT DOCUMENTS

| | | | |
|---|---|---|---|
| 4,175,240 | 11/1979 | Kremlev et al. | 307/450 |
| 4,314,267 | 2/1982 | Bergeron et al. | 307/446 X |
| 4,645,957 | 2/1987 | Baliga | 307/570 |
| 4,663,547 | 5/1987 | Baliga et al. | 307/570 |
| 4,677,325 | 6/1987 | Einzinger et al. | 307/446 X |
| 4,678,936 | 7/1987 | Holloway | 307/296 R X |

FOREIGN PATENT DOCUMENTS 0033464  3/1977  Japan .................. 307/446

OTHER PUBLICATIONS

Delahanty et al., "Depletion-Mode FET Load Devices Switched with Positive Signal Voltage Levels", IBM T.D.B., vol. 19, No. 7, Dec. 1976.

Primary Examiner—David Hudspeth
Attorney, Agent, or Firm—William E. Hiller; N. Rhys Merrett; Melvin Sharp

[57] ABSTRACT

A high withstand voltage output circuit has a pull-up constant current source and transistor connected in series between the grounding side and supply voltage side wherein the breakdown voltage of the constant current source is set higher than the pinch-off voltage of the transistor.

6 Claims, 4 Drawing Sheets

TO PULL--DOWN CIRCUIT

TO PULL--DOWN CIRCUIT

TO PULL--DOWN CIRCUIT

TO PULL--DOWN CIRCUIT

TO PULL--DOWN CIRCUIT

HIGH WITHSTAND VOLTAGE OUTPUT

This application is a continuation of application Ser. No. 055,492, filed May 28, 1987, now abandoned.

BACKGROUND OF THE INVENTION

1. Field of the Invention

The present invention relates to a high withstand voltage output circuit.

2. Description of the Prior Art

In a high withstand voltage pull-up circuit of used for a display driver, it has hitherto been a practice to use a resistor R as shown in FIG. 1 or a high withstand voltage pnp transistor Tr as shown in FIG. 2 for the constant current source. In the drawings of these figures, Q and D represent a transistor and diode, respectively, at the output stage of individual pull-up circuits to one side a supply voltage HVcc applied and with the opposite side connected to the grounding side (pull-down side).

Both the resistor R of FIG. 1 and transistor Tr of FIG. 2 fail to give the desirable high withstand voltage characteristics since these circuit elements, depending on the supply voltage, will break down. Further, in the circuit of FIG. 1, since the resistor R gives no satisfactory constant current characteristics, the low power consumption and fast response speed are incompatible with each other. In the circuit of FIG. 2 the transistor Tr is slow in response speed and dissipates more power because of leakage to the semiconductor substrate.

OBJECTS AND SUMMARY OF THE INVENTION

It is an object of the invention to provide a high withstand voltage output circuit of good constant current characteristics that can be fabricated with high reproducibility of satisfactorily high withstand voltage characteristics.

Namely, the invention relates to a high withstand voltage current circuit in which a pull-up constant current source and a transistor are connected in series between the grounding side and supply voltage side with the breakdown voltage of the constant current source set higher than the pinch-off voltage of that transistor.

Other objects, features, and advantages of the invention will appear more fully from the following detailed description thereof taken in connection with the accompanying drawings.

BRIEF DESCRIPTION OF THE DRAWINGS

Namely, FIG. 3 is an equivalent circuit of a high withstand voltage output circuit embodying the invention.

FIG. 4 is a V-I characteristic curve of a constant current source.

FIG. 5 is a plan view of the output circuit of FIG. 3 only illustrating the major components thereof.

FIG. 6 is a cross section taken on line VI—VI in FIG. 5.

FIG. 7 is an equivalent circuit representing the output circuit of FIG. 3 connected to a pull-down circuit.

FIG. 8 is an equivalent circuit of another high withstand voltage output circuit embodying the invention.

DESCRIPTION OF THE PREFERRED EMBODIMENTS

The invention will be understood more readily with reference to the following examples.

Figure 1:
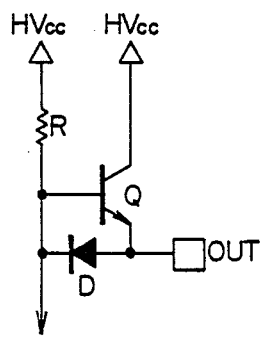
FIGS. 1 and 2 are equivalent circuits of high withstand voltage output circuits of prior art.
Figure 2:
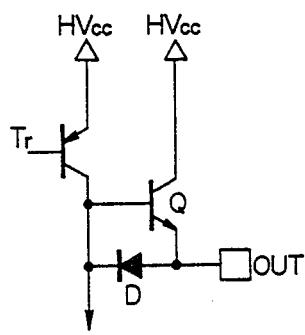
Figure 3:
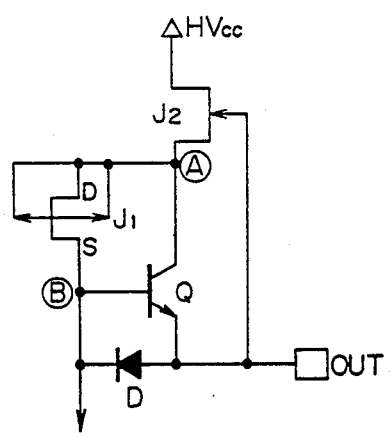
FIGS. 3 to 8 are examples of the invention.

FIG. 3 is a high withstand voltage output circuit embodying the invention, which is quite different from FIGS. 1 and 2 in circuit configuration in that a p-channel junction field effect transistor (hereinafter abbreviated just "JFET") J1 and n-channel bulk JFET J2 are connected in series between the grounding side and supply voltage side to provide a pull-up constant current source wherein the breakdown voltage $BV_{DS}(J1)$ of JFET J1 is higher than the pinch-off voltage $V_P(J2)$ of JFET J2, namely, the following inequality applies:

$$V_P(J2) < BV_{DS}(J1).$$

Figure 4:
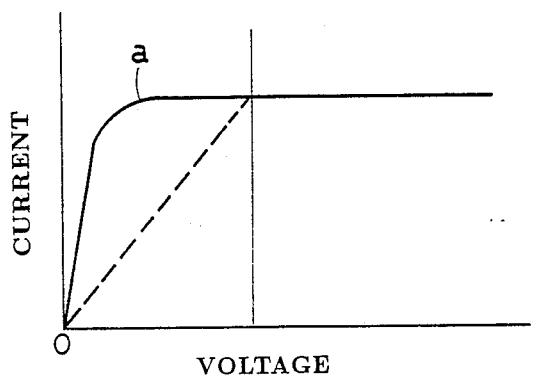

Thus, in the circuit of FIG. 3 the p-channel JFET J1 is connected between nodes Ⓐ and Ⓑ gives a favorable constant current characteristic as shown in the curve a of FIG. 4. Because of the inequality between $V_P(J2)$ and $BV_{DS}(J1)$, as the supply voltage HVcc rises, the JFET J2 is pinched off before the JFET J1 breaks down, thus preventing the application of any overvoltage to the JFET J1 and assuring a high withstand voltage characteristic. The breakdown of the JFET J1 can be avoided because there appears no voltage that is higher than the pinch-off voltage $V_P$ (generally controlled below 40 V) of the FET J2 between the above nodes Ⓐ and Ⓑ. This is equivalent to a high withstand voltage constant current source connected between the supply voltage HVcc and node Ⓑ. Further, use of the JFETs J1 and J2 increases the response speed of the circuit.

J1 and J2 can be fabricated by the Bi-CMOS technology. The monolithic fabrication of a bipolar transistor & complementary metal oxide semiconductor FET to form a logic circuit can be performed without addition of any other process. The device construction thus formed will be described below with reference to FIGS. 5 and 6 (it is noted that the CMOS component is omitted from the drawings and that in FIG. 6 hatching of cross-sectional areas are omitted for convenience of drawing).

Figure 5:
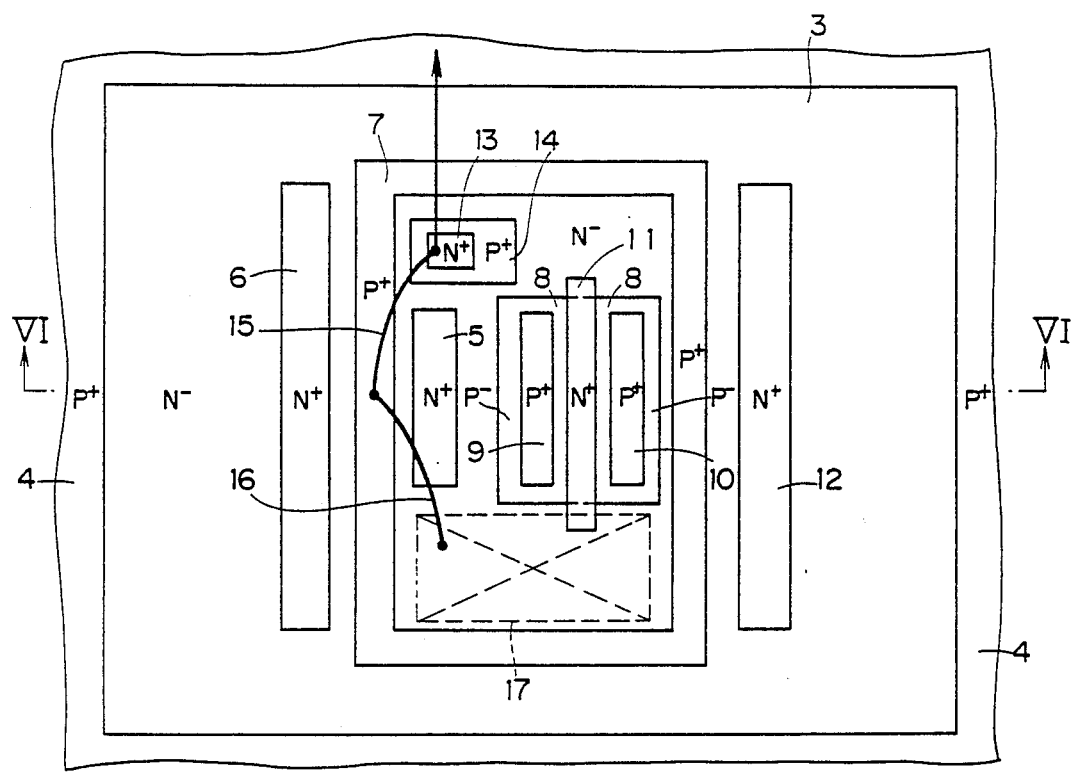
Figure 6:
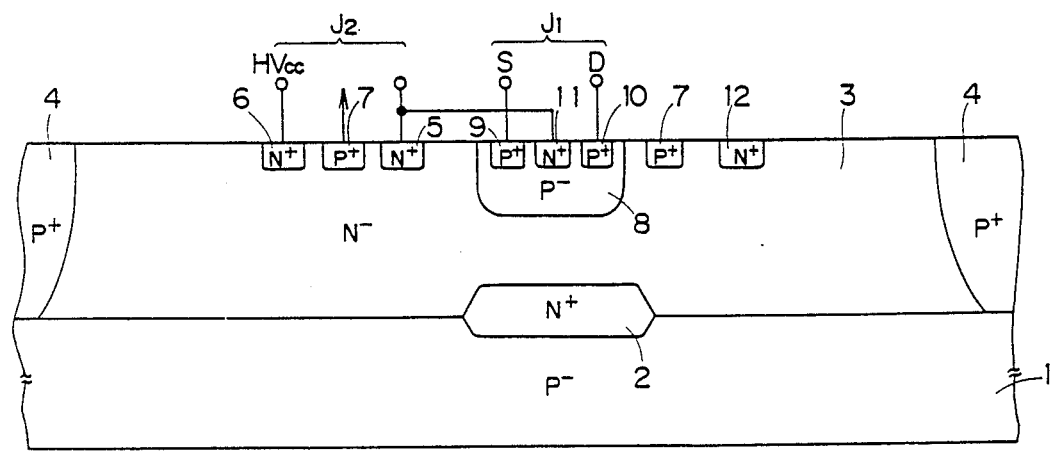

Over a principal plane of a p⁻ silicon substrate 1, a n⁻ epitaxial layer 3 is grown with a n+ layer 2 embedded between the substrate 1 and layer 3. Layer 3 is divided into individual isolated circuit parts by P+ isolation walls 4. In a circuit part, a n-channel bulk JFET J2 is composed of an epitaxial layer 3 as channel, n+ diffusion regions 5 and 6 as source and drain, respectively, and p+ region 7 and substrate 1 form a gate. A p-channel JFET J1 is composed of p+ diffusion regions 9 and 10 as source and drain, respectively, and n+ region 11 and epitaxial layer 3 form a gate. The regions 9, 10 and 11 are formed in the same p⁻ well 8 this is fabricated in the epitaxial layer 3. In epitaxial layer 3, the gate 7 is formed in an annular configuration and the supply voltage is applied to a n+ diffraction region 12. It is noted that the above gate 7 of JFET J2 provides the top gate thereof while the gate 11 of JFET J1 is connected to the back gate (epitaxial layer 3). Regions 13 and 14 in FIG. 5 are the n+ emitter region and p+ base region, respectively, of the transistor Q of FIG. 3. The emitter 13 is connected through a lead 15 to the gate 7 and to an output pad 17 through lead 16. It is noted that if the pad 17 is fabricated in an extended position to cover the pn function between the gate 7 and epitaxial layer 3, a higher withstand voltage will be attained.

The p-channel JFET J1 has a withstand voltage of 60 to 80 V, the voltage that appears between nodes Ⓐ and Ⓑ never exceeds the pinch-off voltage $V_P$ (this parameter is normally controlled 40 V or under) of JFET J2, thus preventing J1 from breakdown. This is equivalent to a high withstand voltage constant current source connected between the supply voltage HVcc and node Ⓑ. The above semiconductor regions can be fabricated by the Bi-CMOS process alone without addition of any other process.

Figure 7:
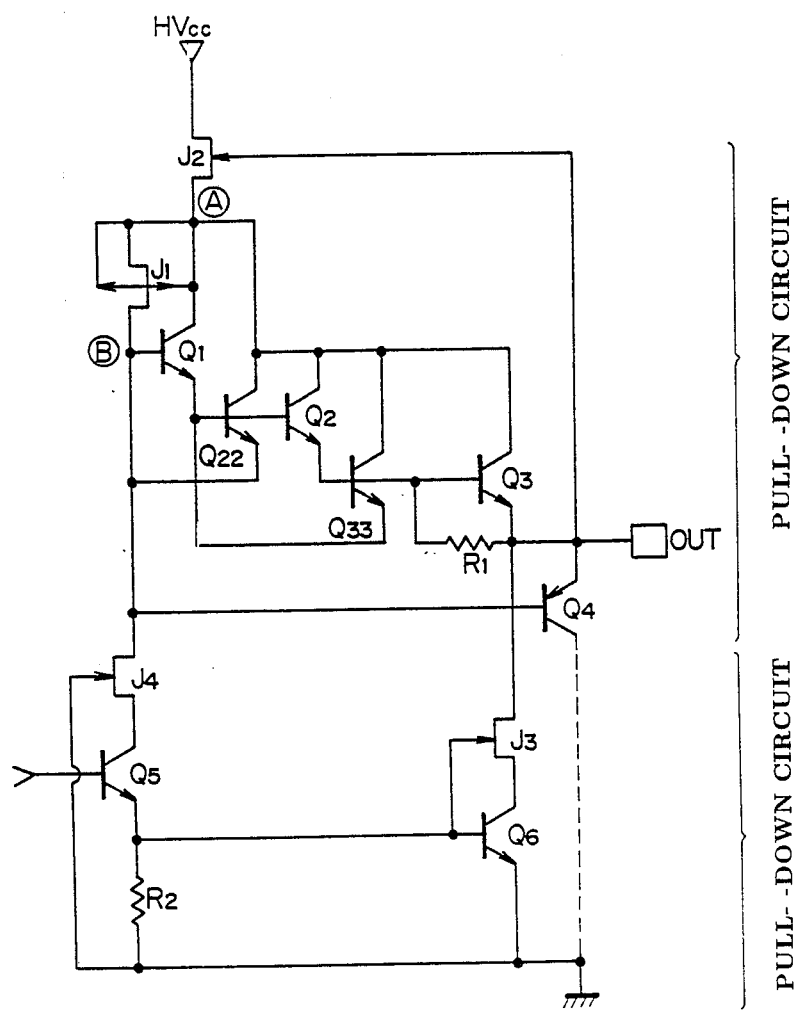

In FIG. 7, the high withstand voltage output circuit is connected as a pull-up circuit to a pull-down circuit (on the grounding side), and the transistor Q of FIG. 4 is replaced by a Darlington circuit composed of transistors Q1, Q2, Q22, Q3 and Q33 with a transistor Q4 used as the diode D. The pull-down circuit is composed of transistors Q5, Q6, JFETs J3, J4, resistor R2, etc. according to conventional practice.

Figure 8:
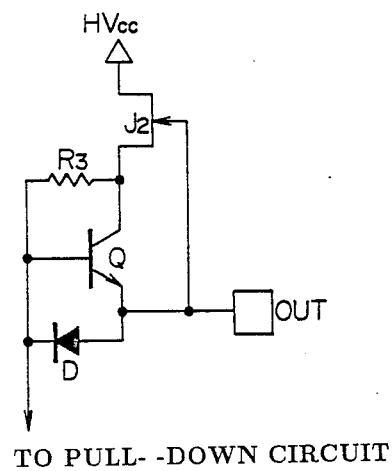

Another high withstand voltage output circuit embodying the invention is given in FIG. 8.

Unlike the example in FIG. 3, a resistor R3 is the constant current source of the pull-up circuit. The voltage applied across resistor never exceeds the pinch-off voltage $V_P$ of JFET J2. The dashed line curve b of FIG. 4 is the constant current characteristic of this circuit, which shows that, though with a performance somewhat inferior to the example to which the JEFT J1 is used (curve a), the circuit is still fully practical.

It will be evident that various modifications can be made to the described embodiments without departing from the scope of the present invention.

For example, the constant current source of the above pull-up circuit can be changed variously while the JFET J2 may be changed in type and/or operational mode. The conductivity types of individual semiconductor regions may also be changed. Further, the output circuit of the invention can be used for applications other than those mentioned above.

In the present invention, since the breakdown voltage of the constant current source of a pull-up circuit is set higher than the pinch-off voltage of a transistor connected on supply voltage side, it is possible to attain a satisfactory constant current characteristic and achieve a high withstand voltage with high reproducibility.

What is claimed is:

1. A high withstand voltage output circuit having a voltage terminal and a pull-down terminal, the high withstand voltage output circuit being a part of a monolithic integrated circuit and comprising: a pull-up constant current source having a first and second circuit element connected in series between the pull-down terminal and supply terminal and said second circuit element includes a FET; an output circuit connected in parallel with the first circuit element and wherein the voltage across said first circuit element is limited by the pinch-off voltage of said FET.

2. The high withstand voltage output circuit as claimed in claim 1 wherein both said first circuit element and said FET are JFETs.

3. The high withstand voltage output circuit as claimed in claim 2 wherein said first circuit element is a p-channel JFET and said FET is a n-channel bulk JFET.

4. The high withstand voltage output circuit as claimed in claim 1 wherein said first circuit element is a resistive element.

5. The high withstand voltage output circuit as claimed in claimed 1 wherein the output circuit comprises a transistor.

6. The high withstand voltage voltage output circuit as claimed in claim 1 wherein the output circuit comprises a plurality of transistors connected as a Darlington circuit.

* * * * *